US010876208B2

(12) United States Patent
Chang et al.

(10) Patent No.: US 10,876,208 B2
(45) Date of Patent: Dec. 29, 2020

(54) APPARATUS AND METHOD FOR FABRICATING A SEMICONDUCTOR DEVICE

(71) Applicant: TAIWAN SEMICONDUCTOR MANUFACTURING COMPANY LTD., Hsinchu (TW)

(72) Inventors: Kai-Hsiang Chang, New Taipei (TW); Keith Kuang-Kuo Koai, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 135 days.

(21) Appl. No.: 16/165,379

(22) Filed: Oct. 19, 2018

(65) Prior Publication Data
US 2019/0218665 A1    Jul. 18, 2019

Related U.S. Application Data

(60) Provisional application No. 62/617,977, filed on Jan. 16, 2018.

(51) Int. Cl.
H01J 37/32      (2006.01)
C23C 16/455    (2006.01)
(Continued)

(52) U.S. Cl.
CPC .... C23C 16/45559 (2013.01); C23C 16/4583 (2013.01); C23C 16/45502 (2013.01);
(Continued)

(58) Field of Classification Search
CPC .............................................. C23C 16/45559
See application file for complete search history.

(56) References Cited

U.S. PATENT DOCUMENTS 6,103,085 A * 8/2000 Woo .......................... C25D 5/08
                                                            205/122
6,197,151 B1 * 3/2001 Kaji ................... H01J 37/32678
                                                            156/345.46
(Continued)

FOREIGN PATENT DOCUMENTS

CN          169308 A      8/2005
CN       105209964 A     12/2015
(Continued)

OTHER PUBLICATIONS

Office Action and Search Report dated Sep. 24, 2020 issued by China National Intellectual Property Administration for counterpart application No. 201811571300.X.
(Continued)

Primary Examiner — Keath T Chen
(74) Attorney, Agent, or Firm — WPAT, P.C., Intellectual Property Attorneys; Anthony King

(57) ABSTRACT

The present disclosure provides an apparatus for fabricating a semiconductor device, including a reaction chamber having a gas inlet for receiving a gas flow, a pedestal in the reaction chamber configured to support a substrate, and a first gas distribution plate (GDP) in the reaction chamber and between the gas inlet and the pedestal, wherein the first GDP is configured to include a plurality of concentric regions arranged along a radial direction, and a plurality of first holes arranged in the concentric regions of the first GDP, an open ratio of the first GDP in an outer concentric region is greater than that in an inner concentric region proximal to the outer concentric region to redistribute the gas flow.

20 Claims, 14 Drawing Sheets

(51) Int. Cl.
*C23C 16/458* (2006.01)
*C23C 16/50* (2006.01)
*H01L 21/285* (2006.01)
*H01L 21/02* (2006.01)

(52) U.S. Cl.
CPC ........ *C23C 16/45565* (2013.01); *C23C 16/50* (2013.01); *H01J 37/3244* (2013.01); *H01J 37/32449* (2013.01); H01L 21/0262 (2013.01); H01L 21/02271 (2013.01); H01L 21/28556 (2013.01)

(56) References Cited

U.S. PATENT DOCUMENTS

| | | | | |
|---|---|---|---|---|
| 6,254,742 | B1* | 7/2001 | Hanson | C25D 17/001 |
| | | | | 204/242 |
| 2003/0140851 | A1* | 7/2003 | Janakiraman | C23C 16/45565 |
| | | | | 118/715 |
| 2004/0108068 | A1* | 6/2004 | Senzaki | H01J 37/32458 |
| | | | | 156/345.43 |
| 2008/0178805 | A1* | 7/2008 | Paterson | H01J 37/32357 |
| | | | | 118/723 I |
| 2009/0095221 | A1* | 4/2009 | Tam | C23C 16/34 |
| | | | | 118/715 |
| 2009/0095222 | A1* | 4/2009 | Tam | C23C 16/34 |
| | | | | 118/723 R |
| 2009/0155488 | A1* | 6/2009 | Nakano | C23C 16/45565 |
| | | | | 427/569 |
| 2014/0061324 | A1* | 3/2014 | Mohn | H01J 37/3244 |
| | | | | 239/1 |
| 2015/0284847 | A1* | 10/2015 | Hong | C23C 16/45519 |
| | | | | 438/478 |
| 2017/0167024 | A1* | 6/2017 | Wiltse | C23C 16/45574 |

FOREIGN PATENT DOCUMENTS

| | | |
|---|---|---|
| CN | 106575597 A | 4/2017 |
| CN | 106906453 A | 6/2017 |
| CN | 106906453 A | 6/2017 |
| TW | 498450 B | 8/2002 |
| TW | 200302510 A | 8/2003 |
| TW | I525212 B | 3/2016 |

OTHER PUBLICATIONS

Office action from Taiwanese counterpart 107145958 dated Jul. 21, 2020.

* cited by examiner

APPARATUS AND METHOD FOR FABRICATING A SEMICONDUCTOR DEVICE

CROSS REFERENCE TO RELATED APPLICATIONS

This application claims the benefit of prior-filed provisional application No. 62/617,977, filed Jan. 16, 2018.

BACKGROUND

In the semiconductor industry, apparatus such as chemical vapor deposition apparatus, stripping apparatus, or etching apparatus utilizes gas flow to deposit or remove various layers above the substrate. However, the non-uniform gas flow profile from the gas source induces poor uniformity of the film profile.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
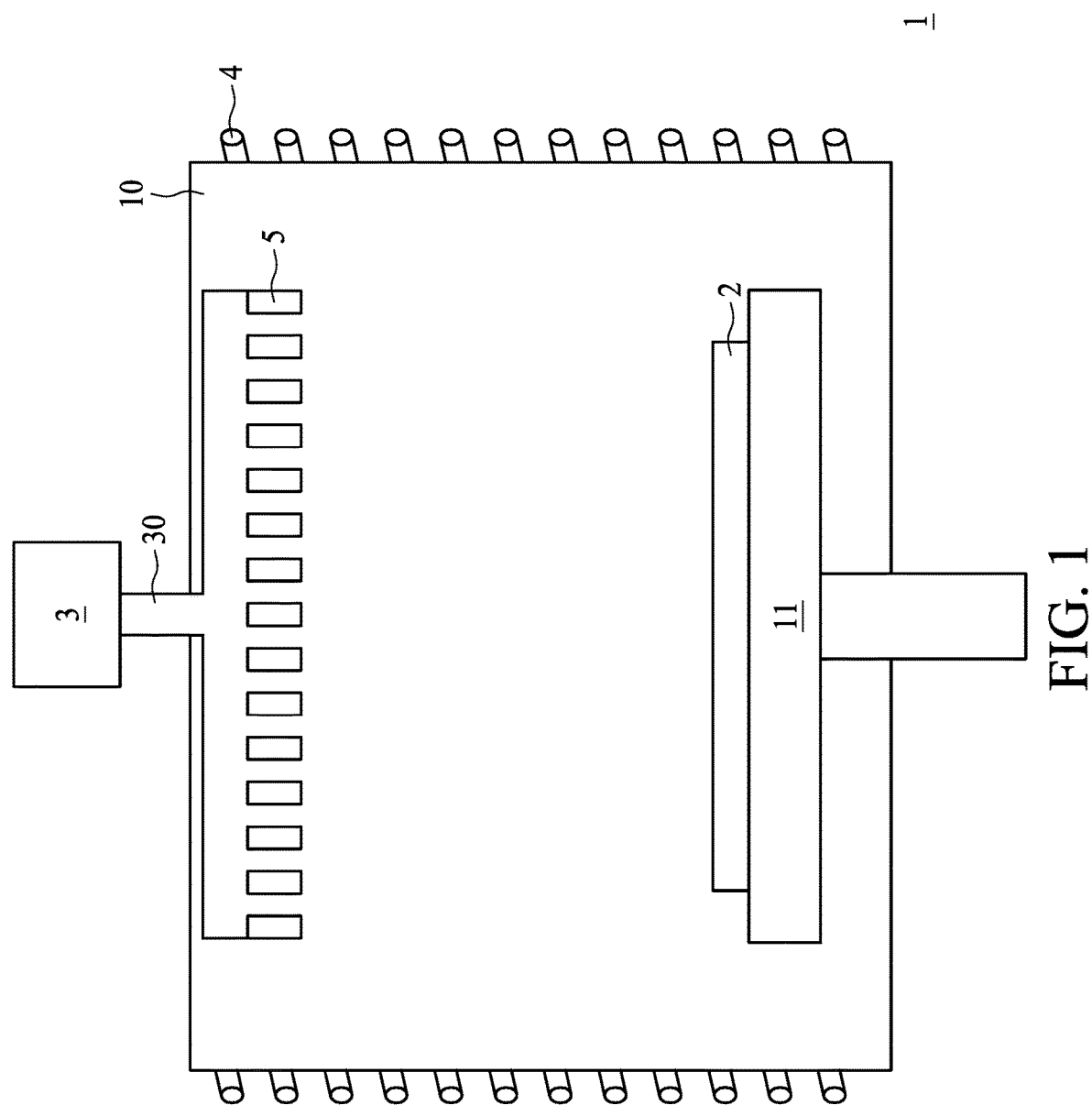
FIG. 1 is a schematic drawing illustrating an apparatus for fabricating a semiconductor device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

In semiconductor manufacturing, plasma ashing is performed to remove the majority of the photoresist from a wafer. A reactive species is generated by using a plasma source, wherein oxygen and fluorine are two of the most common reactive species. Combining the reactive species with the photoresist may form ash, as the ash can be removed subsequently. Typically, monatomic oxygen plasma is created by exposing oxygen gas to high-frequency waves. Many fabrication methods may opt to use a downstream plasma configuration, wherein plasma is formed remotely and the desired particles are channeled to the wafer, alleviating damages to the wafer surface.

However, due to the non-uniform plasma flow profile, the ashing rate on the wafer may also be non-uniform, for example, lower reaction rate at peripheral area and/or relatively thicker/thinner film in certain dimension. Similar phenomena of non-uniform reaction rate above the substrate can be found in other operations that use gas flow including gaseous substances and/or plasma flow, for example etching, film depositing, chemical vapor deposition (CVD), or the like. In order to perform a relatively uniform reactive operation, the gas flow profile of the reaction gas may be adjusted. The present disclosure provides a gas distribution plate (GDP) that may improve the uniformity of the gas flow provided by the gas source.

Referring to FIG. 1, FIG. 1 is a schematic drawing illustrating an apparatus 1 for fabricating a semiconductor device, in accordance with some embodiments of the present disclosure. In some embodiments, the apparatus 1 includes a reaction chamber 10, a pedestal 11 disposed inside the reaction chamber 10, a gas inlet 30 above the pedestal 11, and a first gas distribution plate (GDP) 5 disposed between the pedestal 11 and the gas inlet 30. In some embodiments, the gas inlet 30 is coupled to a gas source 3. In some embodiments, the gas source 3 is a gas supply system. The gas source 3 may further include flow lines, pressure regulators, valves, mass flow controllers, or other flow controllers, manifolds, and/or regulators (not shown in FIG. 1). The gas source 3 is in communication with the gas inlet 3, supplying a predetermined gas flow, for example gaseous substances, plasma, a combination of gas flow and plasma, or the like, into the reaction chamber 10 through the gas inlet 30 and the gas flow subsequently flows toward the substrate 2. The first GDP 5 is configured to improve the uniformity of the gas flow. In some embodiments, the first GDP 5 is coupled to the gas inlet 30. While in some other embodiments, the first GDP 5 is not coupled to the gas inlet 30.

A substrate 2 is supported by the pedestal 11. In some embodiments, the pedestal 11 may be placed centrally in the reaction chamber 10. In some embodiments, the pedestal 11 may be electrostatic chuck (E-chuck), vacuum chuck, clamp, or other suitable devices that can secure the substrate 2. The pedestal 11 may, or may not be further connected to a power supply, a heater, or an electrode (not shown in FIG. 1). Note that the substrate 2 is not limited to wafer herein, the substrate 2 may be a silicon substrate, a III-V compound substrate, a glass substrate, a liquid crystal display substrate, a printed circuit board (PCB), or any other substrate similar thereto.

In some embodiments, the apparatus 1 may further include coil 4 to generate plasma. The coil 4 may be connected to a power supply (not shown in FIG. 1) such as RF, microwave, high-frequency wave, or the like, but the disclosure is not limited thereto. The coil 4 is configured to generate ionized gas wherein the gas flow is provided from the gas inlet 30. In some other embodiments, the apparatus 1 may not include coil 4.

Figure 2A:
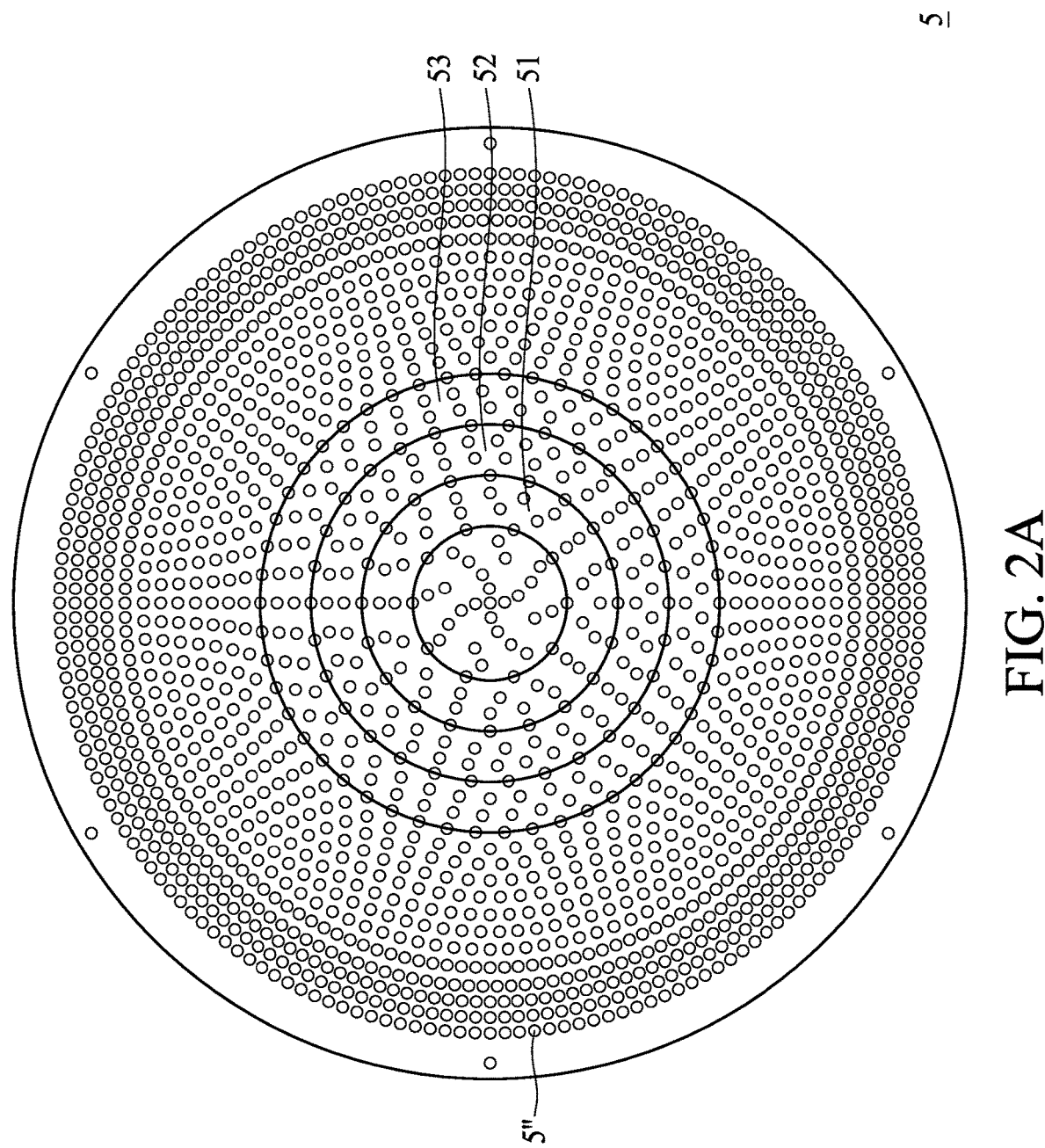
FIG. 2A is a top view of a gas distribution plate (GDP), in accordance with some embodiments of the present disclosure.

Referring to FIG. 2A, a plurality of first holes 5" substantially having a same size are arranged on the first GDP 5. In some embodiments, the plurality of first holes 5" are through apertures. In some embodiments, the plurality of first holes 5" may be round holes. The first GDP 5 includes a plurality of concentric regions, herein demonstrated in FIG. 2A as a first region 51, a second region 52, and a third region 53, et cetera. The third region 53 is surrounding and adjacent to the second region 52; the second region 52 is surrounding and adjacent to the first region 51. In order to improve the uniformity of a predetermined reaction rate both at an peripheral area and an inner area of the substrate 2, in the cases of the reaction rate at peripheral area of the substrate 2 is relatively slower, an open ratio of an inner concentric region proximal to the center of the first GDP 5 is lower than an open ratio of an outer concentric region distal to the center of the first GDP 5, wherein the open ratio is defined as the total area of the holes within the predetermined region over the total area of the predetermined region per se. For example, an open ratio of the first region 51 is lower than an open ratio of the second region 52, while an open ratio of the third region is greater than an open ratio of the second region 52. In some embodiments, the first region 51, the second region 52, and the third region 53 have a same width measured along a radial direction of the first GDP 5. Under this circumstance, a density of the first holes 5" within the second region 52 may be greater than a density of the first holes 5" within the first region 51, a density of the first holes 5" within the third region 53 may be greater than the density of the first holes 5" within the second region 52. The size and the densities of the first holes 5" within a predetermined region can be adjusted according to reaction rate profile of the operation.

Figure 2B:
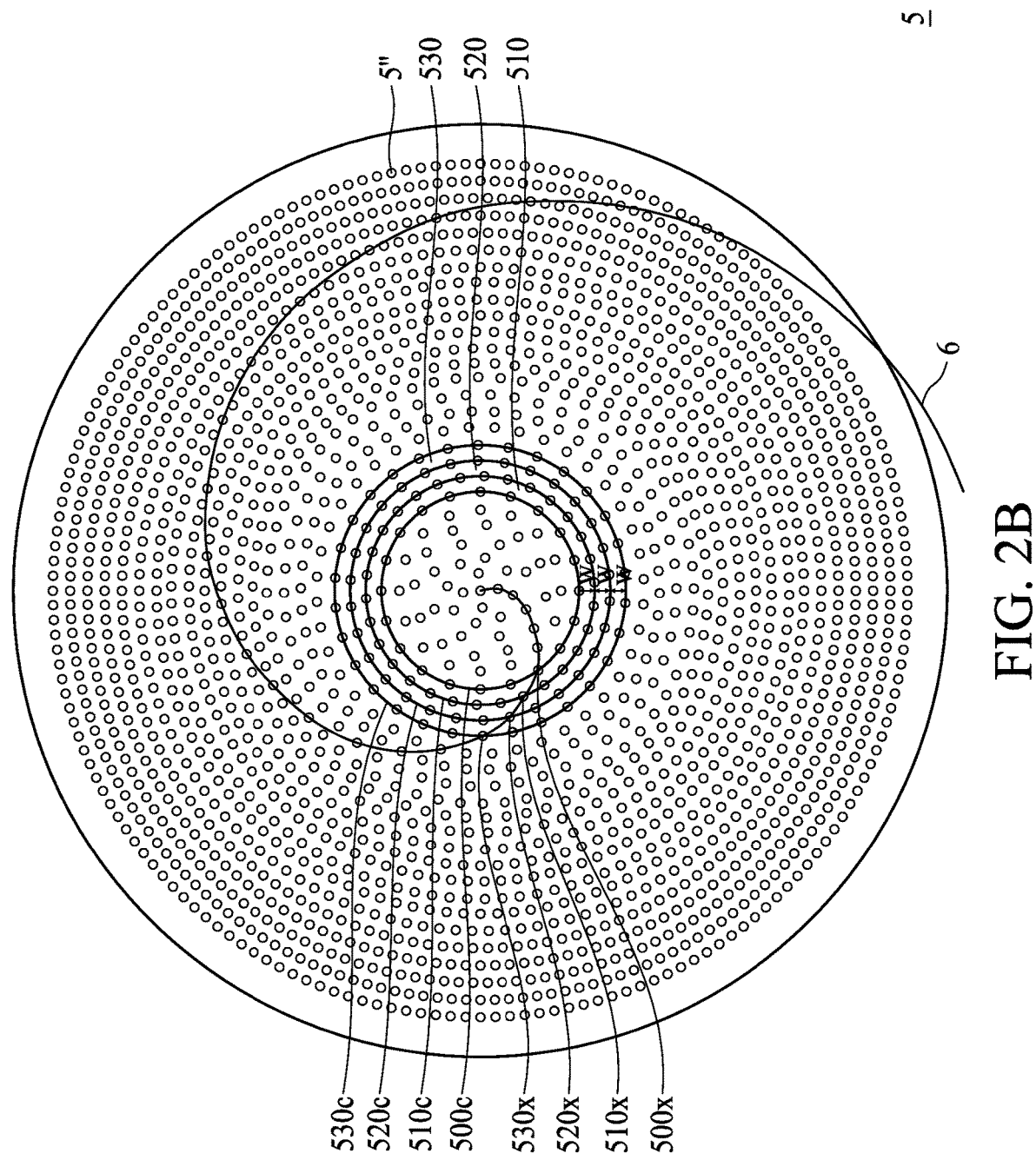
FIG. 2B is a top view of a gas distribution plate (GDP), in accordance with some embodiments of the present disclosure.

FIG. 2B illustrates some embodiments pertinent to the pattern of the plurality of first holes 5". In some embodiments, the first GDP 5 includes a plurality of concentric boundaries, herein demonstrated in FIG. 2B as an inner boundary 500c, a first boundary 510c, a second boundary 520c, and a third boundary 530c, et cetera. A first area 510 is enclosed by the inner boundary 500c and the first boundary 510c. A second area 520 is enclosed by the first boundary 510c and the second boundary 520c. A third area 530 is enclosed by the second boundary 520c and the third boundary 530c. In some embodiments, the first area 510, the second area 520, and the third area 530 have a same width W measured along a radial direction of the first GDP 5. In some embodiments, the width W is in a range from about 5 mm to about 9 mm, but the disclosure is not limited thereto. In some embodiments, the plurality of first holes 5" in the first area 510, the second area 520, and the third area 530 may have substantially equal size.

In order to improve the uniformity of the gas flow flowed through the plurality of the first holes 5", the plurality of the first holes 5" can be dispersedly arranged rather than having significantly higher density of the first hole 5" along a certain linear direction of the first GDP 5. In some embodiments, an imaginary curve line 6 starts from a center or an original point of the first GDP 5, and ends at an outer point on the first GDP 5 proximal to a peripheral region of the first GDP 5 or extends through the edge of the first GDP 5. In some embodiments, the imaginary curve line 6 may be a spiral curve line. A plurality of initial holes, herein demonstrated in FIG. 2B as 510x, 520x, 530x, are at the intersections of the imaginary curve line 6 and the plurality of concentric boundaries. For example, the initial hole 510x is arranged at the intersection of the first boundary 510c and the imaginary curve line 6, the initial hole 520x is arranged at the intersection of the second boundary 520c and the imaginary curve line 6, the initial hole 530x is arranged at the intersection of the third boundary 530c and the imaginary curve line 6. The initial hole furthest away from the center or the original point of the first GDP 5 is within and proximal to the edge of the first GDP 5. In some embodiments, the plurality of initial holes may be disposed equidistally on the imaginary curve line 6. In some embodiments, the imaginary curve line 6 may be an Archimedean spiral curve line, wherein the imaginary curve line 6 has a function of r=a*θ+b, wherein r and θ are polar coordinates, and a and b are constants. In some embodiments the constant a is greater or smaller than zero.

In some embodiments, once the positions of the plurality of initial holes, for example 510x, 520x, 530x, are determined, a plurality of first holes concyclic with the plurality of initial holes can be positioned. For example, once the position of the initial hole 510x is determined, a predetermined number of the first holes 5" can be arranged along the first boundary 510c, each dispersed by predetermined angles relative to the original point or the center of the first GDP 5, or separated by predetermined distances. In some embodiments, the spaces between each of the first holes 5" arranged along the first boundary 510c are substantially equal. In some embodiments, each of the first holes 5" may be determined by each of position of the initial holes and the concentric boundaries. In some embodiments, a first hole 5" is further arranged at the starting point of the imaginary curve line 6.

Figure 3A:
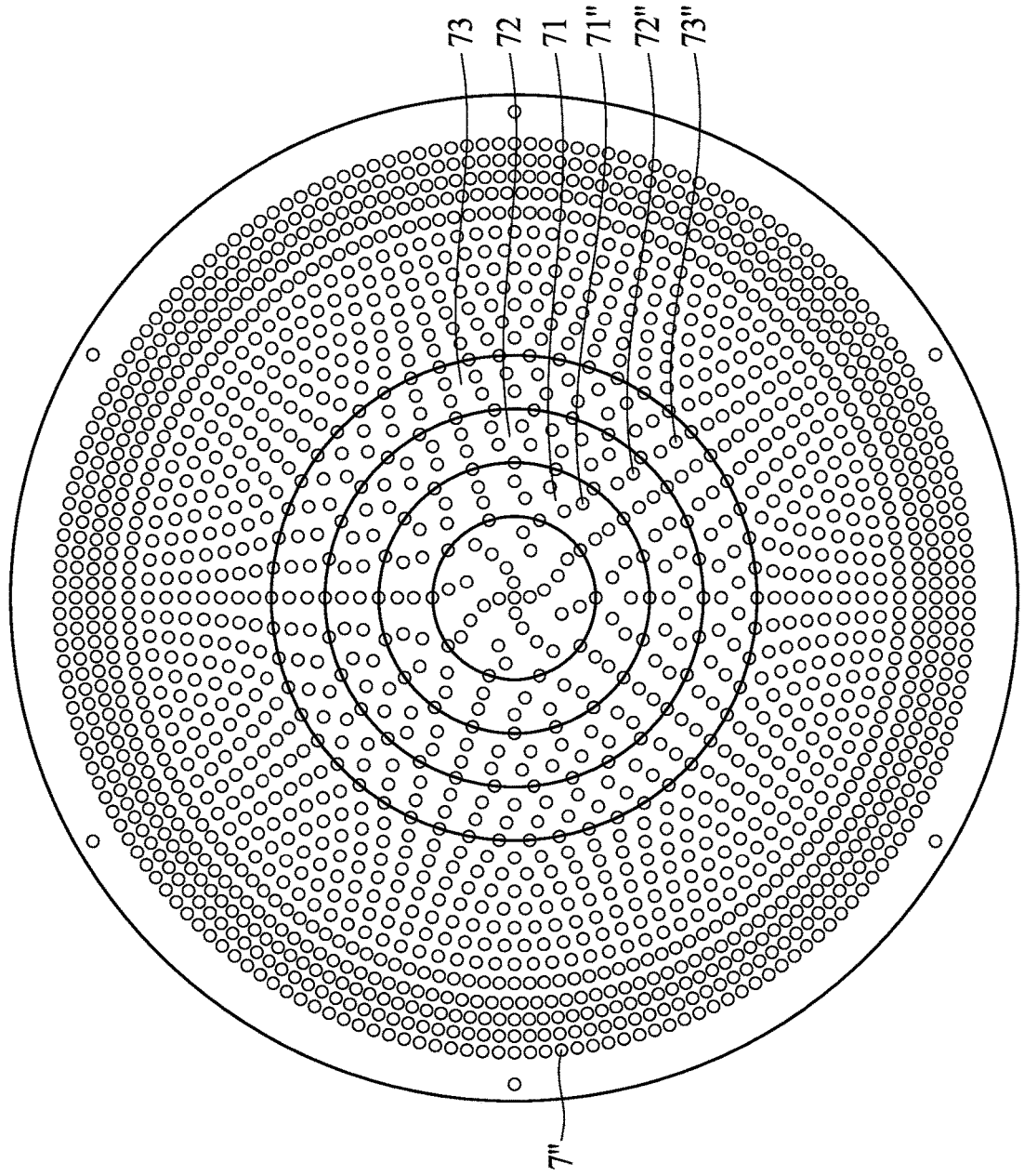
FIG. 3A is a top view of a gas distribution plate (GDP), in accordance with some embodiments of the present disclosure.

In some other embodiments, referring to FIG. 3A, a plurality of first holes 7" with various sizes are arranged on the first GDP 5. In some embodiments, the plurality of first holes 7" are through apertures. In some embodiments, the plurality of first holes 5" may be round holes. The first GDP 5 includes a plurality of concentric regions, herein demonstrated in FIG. 3A as a first region 71, a second region 72, and a third region 73, et cetera. The third region 73 is surrounding and adjacent to the second region 72; the second region 72 is surrounding and adjacent to the first region 71. In order to improve the uniformity of a predetermined reaction rate both at an peripheral area and an inner area of the substrate 2, in the cases of the reaction rate at peripheral area of the substrate 2 is relatively slower, an open ratio of an inner concentric region proximal to the center of the first GDP 5 is lower than an open ratio of an outer concentric region distal to the center of the first GDP 5, wherein the open ratio is defined as the total area of the holes within the predetermined region over the total area of the predetermined region per se. For example, an open ratio of the first region 71 is lower than an open ratio of the second region 72, while an open ratio of the third region is greater than an open ratio of the second region 72. In some embodiments, a density of the first holes 7" within the first region 71 (hereinafter the first holes 71"), a density of the first holes 7" within the second region 72 (hereinafter the first holes 72"), a density of the first holes 7" within the third region 73 (hereinafter the first holes 73") are substantially equal. Under this circumstance, in some embodiments, a size of the first holes 72" is greater than a size of the first holes 71", a size of the first holes 73" is greater than a size of the first holes 72". The sizes and the densities of the first holes 7" within a predetermined region can be adjusted according to the reaction rate profile of the operation.

In some other embodiments, the first region 71, the second region 72, and the third region 73 have a same width measured along a radial direction of the first GDP 5. In some embodiments, a density of the first holes 72" within the second region 72 may be greater than a density of the first holes 71" within the first region 71, a density of the first holes 73" within the third region 73 may be greater than the density of the first holes 72" within the second region 72. A size of the first holes 72" is greater than or equal to a size of the first holes 71", a size of the first holes 73" is greater than or equal to a size of the first holes 72".

Figure 3B:
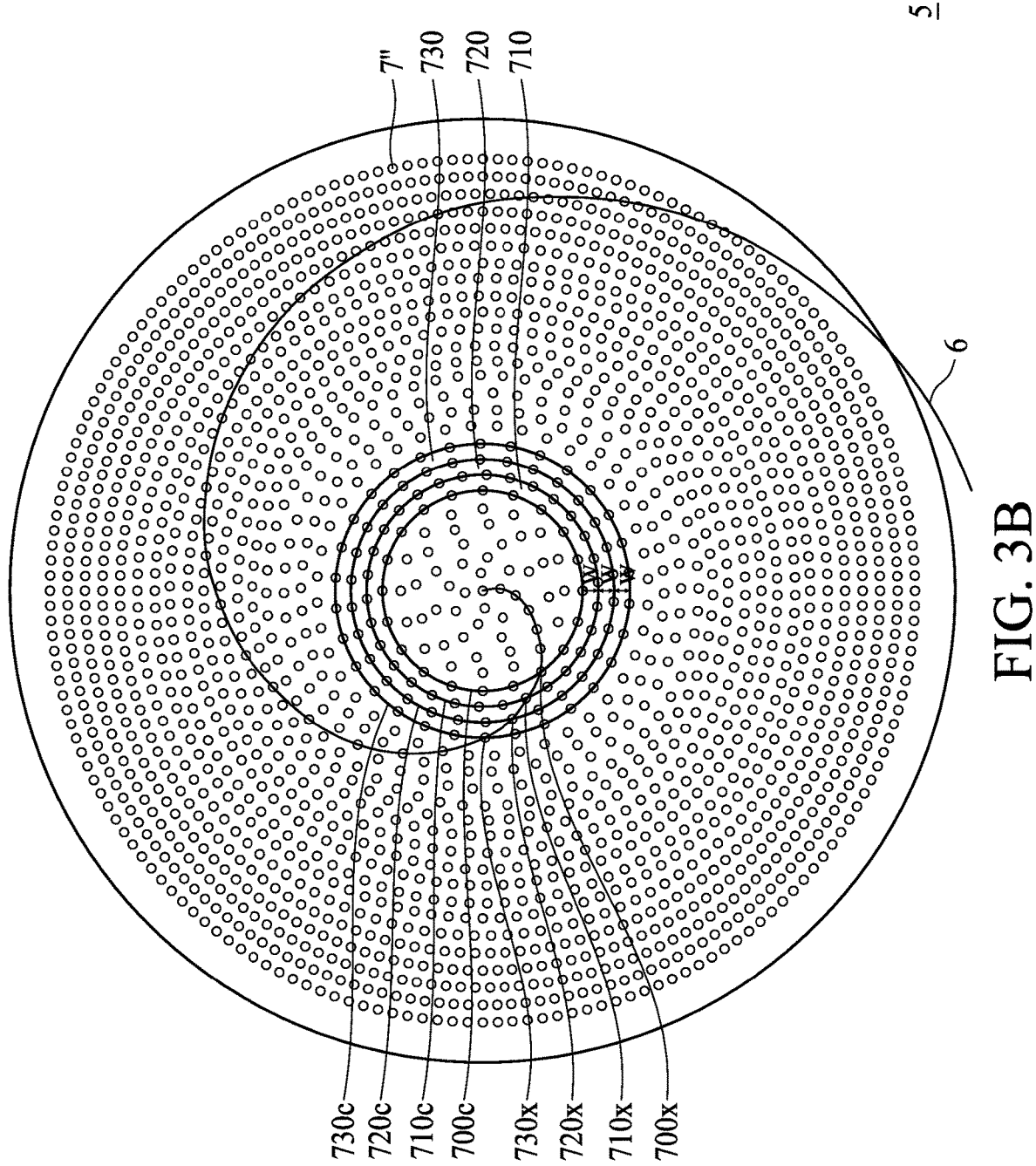
FIG. 3B is a top view of a gas distribution plate (GDP), in accordance with some embodiments of the present disclosure.

FIG. 3B illustrates some embodiments pertinent to the pattern of the plurality of first holes 7". In some embodiments, the first GDP 5 includes a plurality of concentric boundaries, herein demonstrated in FIG. 3B as an inner boundary 700c, a first boundary 710c, a second boundary 720c, and a third boundary 730c, et cetera. A first area 710 is enclosed by the inner boundary 700c and the first boundary 710c. A second area 720 is enclosed by the first boundary 710c and the second boundary 720c. A third area 730 is enclosed by the second boundary 720c and the third boundary 730c. In some embodiments, the first area 710, the second area 720, and the third area 730 have a same width W measured along a radial direction of the first GDP 5. In some embodiments, the width W is in a range from about 5 mm to about 9 mm, but the disclosure is not limited thereto. In some embodiments, a size of the first holes 7" within the second area 720 is greater than a size of the first holes 7" within the first area 710, a size of the first holes 7" within the third area 730 is greater than a size of the first holes 7" within the second area 720.

Similar to aforesaid arrangement in FIG. 2B, in order to improve the uniformity of the gas flow flowed through the plurality of the first holes 7", the plurality of the first holes 7" can be dispersedly arranged rather than having significantly higher density of the first holes 7" along a certain linear direction of the first GDP 5. Referring to FIG. 3B, in some embodiments, an imaginary curve line 6 starts from a center or an original point of the first GDP 5, and ends at an outer point on the first GDP 5 proximal to a peripheral region of the first GDP 5 or extends through the edge of the first GDP 5. In some embodiments, the imaginary curve line 6 may be a spiral curve line. A plurality of initial holes, herein demonstrated in FIG. 3B as 710x, 720x, 730x, are at the intersections of the imaginary curve line 6 and the plurality of concentric boundaries. For example, the initial hole 710x is arranged at the intersection of the first boundary 710c and the imaginary curve line 6, the initial hole 720x is arranged at the intersection of the second boundary 720c and the imaginary curve line 6, the initial hole 730x is arranged at the intersection of the third boundary 730c and the imaginary curve line 6. The initial hole furthest away from the center or the original point of the first GDP 5 is within and proximal to the edge of the first GDP 5. In some embodiments, the plurality of initial holes may be disposed equidistally on the imaginary curve line 6. In some embodiments, the imaginary curve line 6 may be an Archimedean spiral curve line, wherein the imaginary curve line 6 has a function of r=a*θ+b, wherein r and θ are polar coordinates, and a and b are constants. In some embodiments the constant a is greater or smaller than zero.

In some embodiments, once the positions of the plurality of initial holes, for example 710x, 720x, 730x, are determined, a plurality of first holes concyclic with the plurality of initial holes can be positioned. For example, once the position of the initial hole 710x is determined, a predetermined number of the first holes 7" can be arranged along the first boundary 710c, each dispersed by predetermined angles relative to the original point or the center of the first GDP 5, or separated by predetermined distances. In some embodiments, the spaces between each of the first holes 7" arranged along the first boundary 710c are substantially equal. In some embodiments, each of the first holes 7" may be determined by each of position of the initial holes and the concentric boundaries. In some embodiments, a first hole 7" is further arranged at the starting point of the imaginary curve line 6.

Figure 4A:
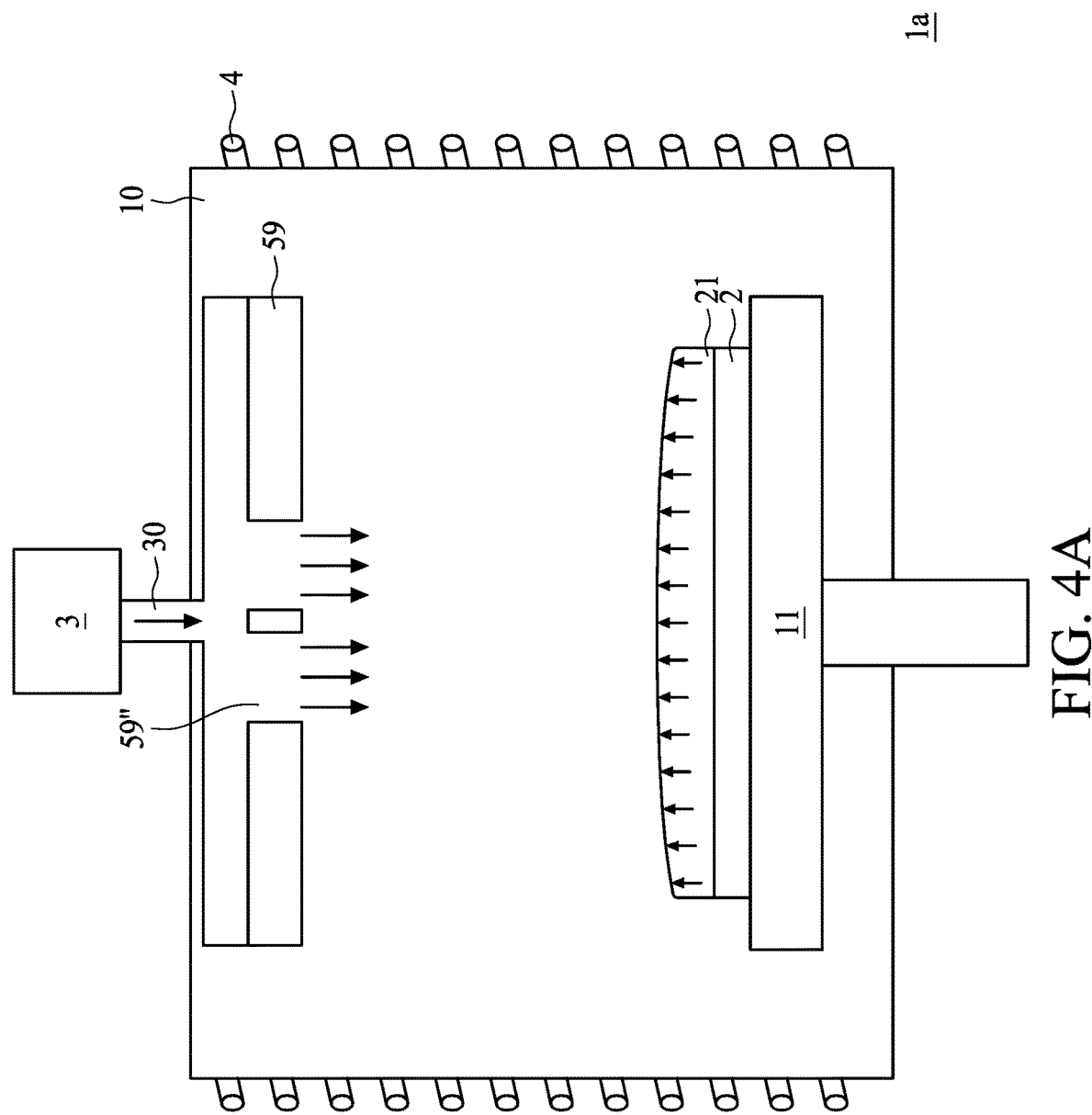
FIG. 4A is a schematic drawing illustrating an apparatus during a semiconductor device fabricated at various stages.

Referring to FIG. 4A, FIG. 4A illustrates a gas distribution plate 59 with one or more holes 59" configured inside an apparatus 1a, provided between the gas inlet 30 and the substrate 2. An open ratio of the central area of the gas distribution plate 59 is significantly greater than an open ratio of the peripheral area of the gas distribution plate 59. A predetermined gas flow of a predetermined operation is supplied from the gas inlet 30, flowed through the plurality of the first holes 59" of gas distribution plate 59 and subsequently flowed toward the substrate 2. A layer 21 is thereby formed above the substrate 2. However, due to the non-uniform profile of the gas flow flowed through the gas distribution plate 59, the layer 21 formed on the substrate 2 has a non-uniform thickness profile, for example, a thickness of the center area of the substrate 2 being greater than a thickness of the peripheral area of the substrate 2.

Figure 4B:
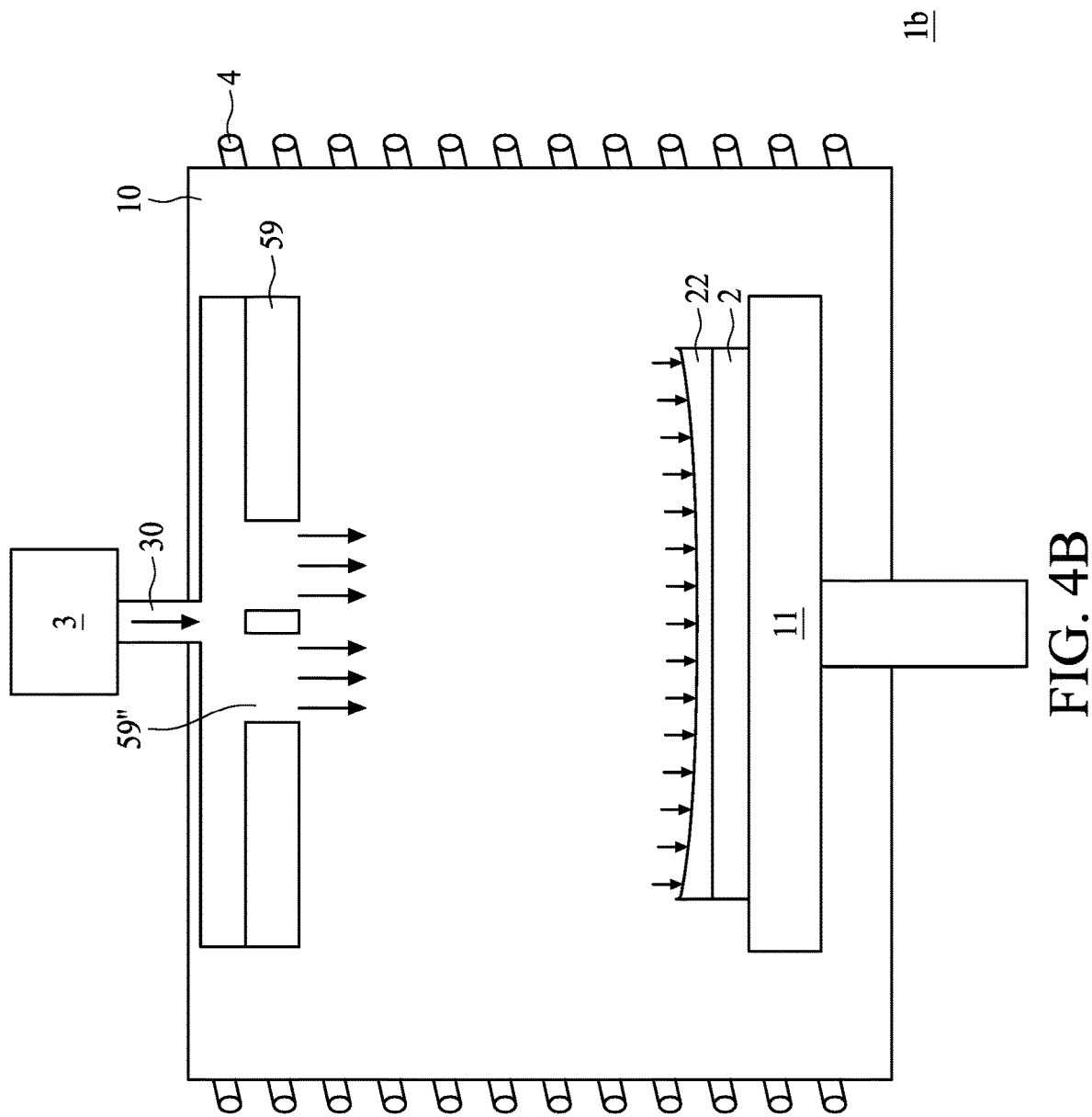
FIG. 4B is a schematic drawing illustrating an apparatus during a semiconductor device fabricated at various stages.

Referring to FIG. 4B, FIG. 4B illustrates a gas distribution plate 59 with one or more holes 59" configured inside an apparatus 1b, provided between the gas inlet 30 and the substrate 2. An open ratio of the central area of the gas distribution plate 59 is significantly greater than an open ratio of the peripheral area of the gas distribution plate 59. A predetermined gas flow of a predetermined operation is supplied from the gas inlet 30, flowed through the plurality of the first holes 59" of gas distribution plate 59 and subsequently flowed toward the substrate 2. A layer 22 above the substrate 2 is thereby removed. However, due to the non-uniform profile of the gas flow flowed through the gas distribution plate 59, the layer 22 remained on the substrate 2 has a non-uniform thickness profile, for example, a thickness of the center area of the substrate 2 being less than a thickness of the peripheral area of the substrate 2.

Figure 5:
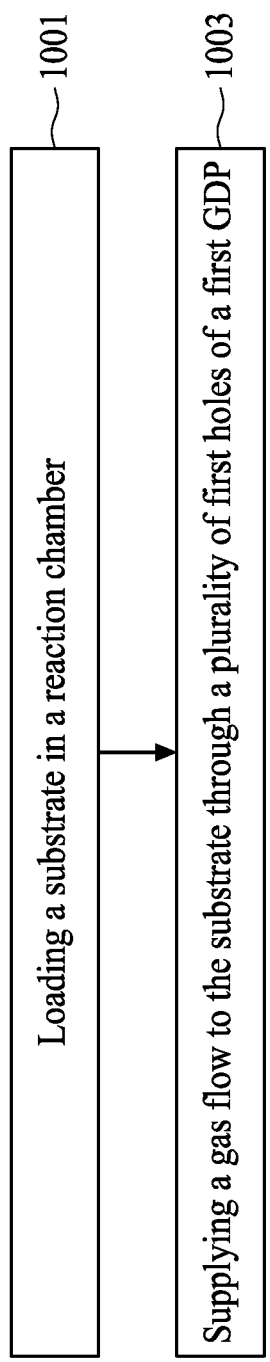
FIG. 5 shows a flow chart representing method for fabricating a semiconductor device according to aspects of the present disclosure in one or more embodiments.

FIG. 5 is a flow chart of fabricating a semiconductor device. The method for semiconductor device may include loading a substrate in a reaction chamber (operation 1001), and processing the substrate by supplying a gas flow from a gas inlet to the substrate through a plurality of first holes of a first GDP (operation 1003).

Figure 6A:
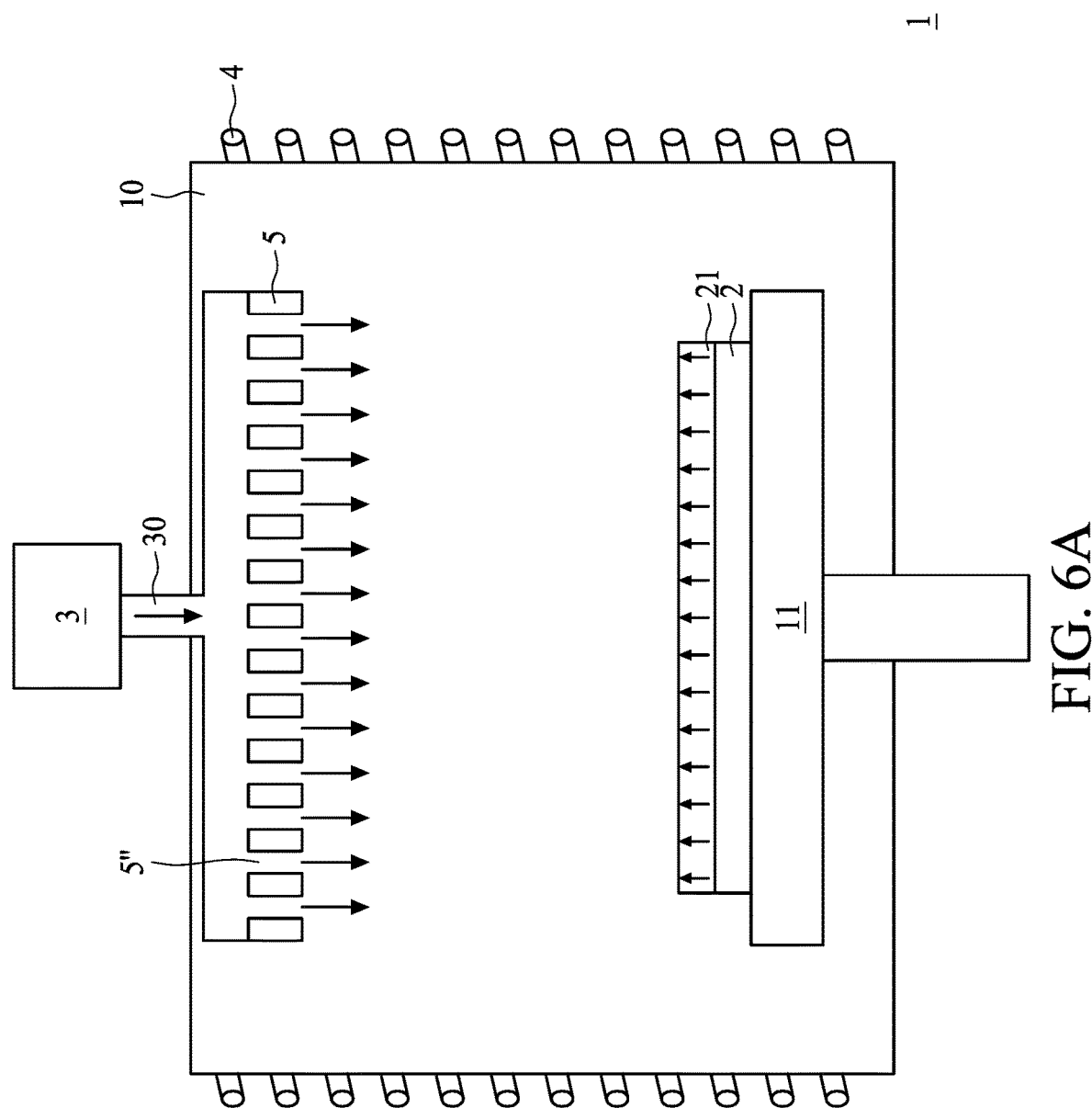
FIG. 6A is a schematic drawing illustrating an apparatus during a semiconductor device fabricated at various stages, in accordance with some embodiments of the present disclosure.

Referring to FIG. 6A, the reaction chamber 10 having the gas inlet 30 and the first GDP 5 previously discussed in FIG. 2A, 2B, 3A, or 3B is provided and the substrate 2 is loaded in the reaction chamber 10. Subsequently a gas flow of a predetermined operation is supplied from the gas inlet 30, flowed through the plurality of the first holes 5" of the first GDP 5 and thus flowed toward the substrate 2. A layer 21 is thereby formed above the substrate 2. In some embodiments, the operation includes chemical vapor deposition (CVD), plasma-enhanced CVP (PECVD), metal-organic CVD (MOCVD), atomic layer deposition (ALD), remote plasma enhanced CVD (RPECVD), liquid source misted chemical deposition (LSMCD), film depositing, or the like. In some embodiments, the gas flow may include gaseous substances, plasma, a combination of gas flow and plasma, or the like.

Figure 6B:
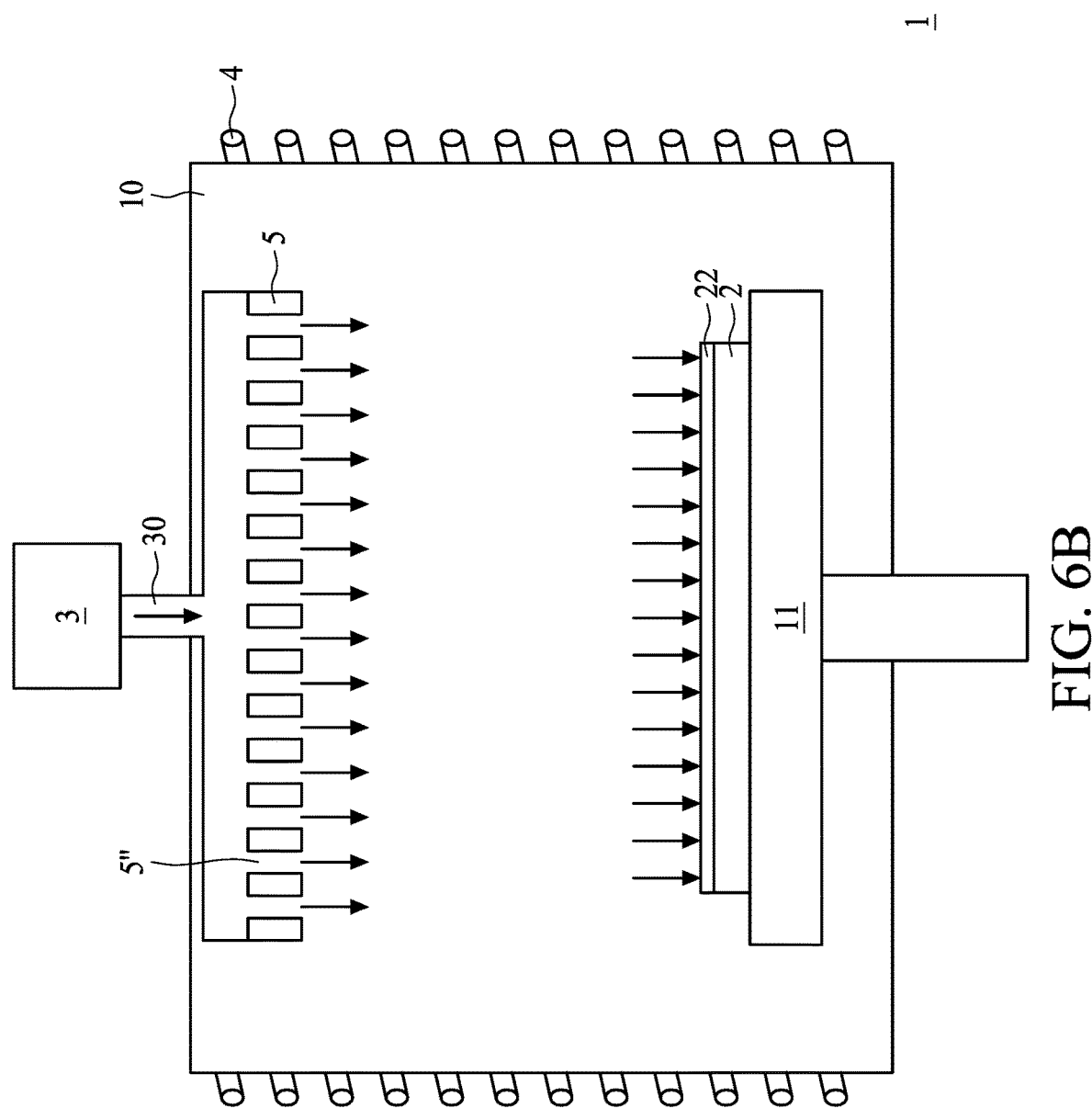
FIG. 6B is a schematic drawing illustrating an apparatus during a semiconductor device fabricated at various stages, in accordance with some embodiments of the present disclosure.

Referring to FIG. 5 and FIG. 6B, the reaction chamber 10 having the gas inlet 30 and the first GDP 5 previously discussed in FIG. 2A, 2B, 3A, or 3B is provided and the substrate 2 is loaded in the reaction chamber 10. Subsequently a gas flow of a predetermined operation is supplied from the gas inlet 30, flowed through the plurality of the first holes 5" of the first GDP 5 and thus flowed toward the substrate 2. A layer 22 above the substrate 2 is thereby removed. In some embodiments, the operation includes ashing/stripping, etching, film removal, or the like. In some embodiments, the gas flow may include gaseous substances, plasma, a combination of gas flow and plasma, or the like.

Figure 7:
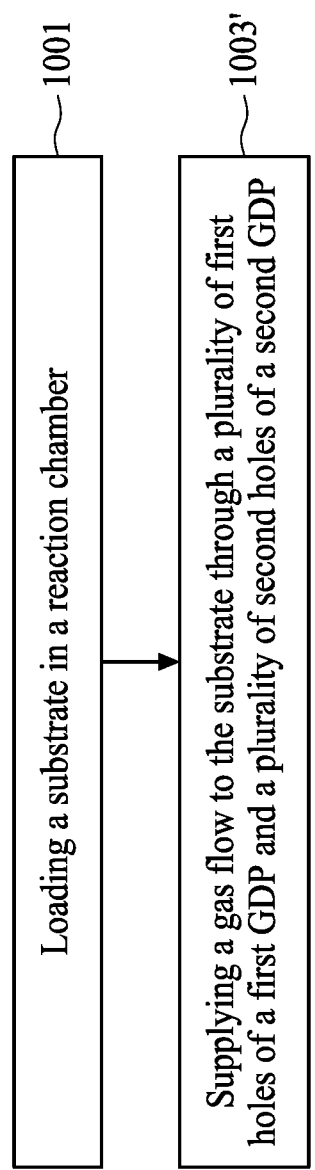
FIG. 7 is a flow chart representing method for fabricating a semiconductor device according to aspects of the present disclosure in one or more embodiments.

FIG. 7 is a flow chart of fabricating a semiconductor device. The method for semiconductor device may include loading a substrate in a reaction chamber (operation 1001), and processing the substrate by supplying a gas flow from a gas inlet to the substrate through a plurality of first holes of a first GDP and a plurality of second holes of a second GDP (operation 1003').

Figure 8:
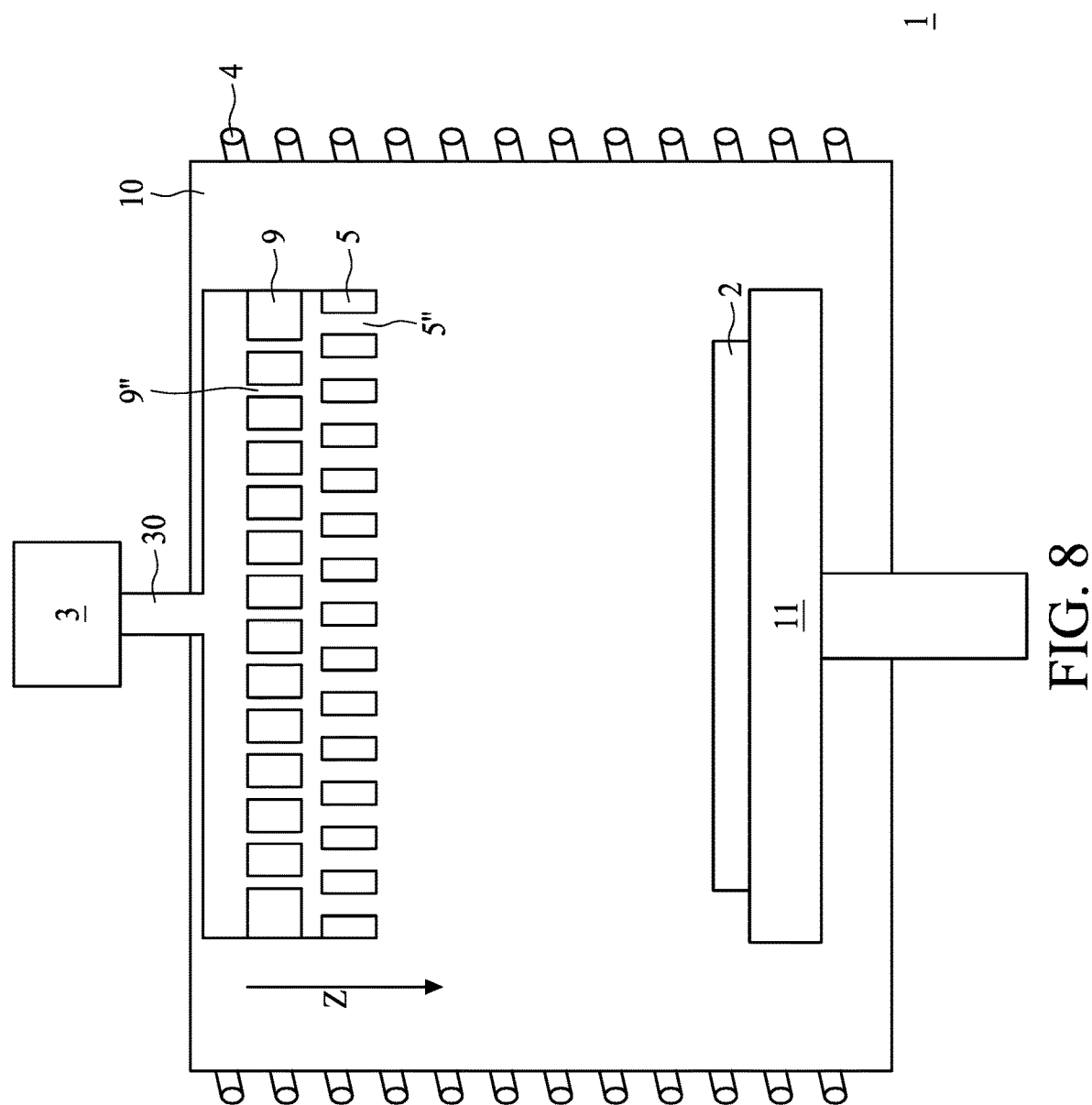
FIG. 8 shows a schematic drawing illustrating an apparatus for fabricating a semiconductor device, in accordance with some embodiments of the present disclosure.

In some embodiments, referring to FIG. 8, the apparatus 1 may further include a second GDP 9 disposed between the first GDP 5 and the gas inlet 30. In some embodiments, the second GDP 9 is coupled to the gas inlet 30; while in some other embodiments, the second GDP 9 is not coupled to the gas inlet 30. By virtue of the second GDP 9 between the first GDP 5 and the gas inlet 30, the effectiveness of redistributing the gas flow may be further improved. In some embodiments, the second GDP 9 includes a plurality of second holes 9". In some embodiments, the arrangement of the plurality of second holes 9" is similar to the first GDP 5 as previously discussed in FIG. 2A, 2B, 3A, or 3B. In some embodiments, an open ratio of an inner concentric region proximal to the center of the second GDP 9 is lower than an open ratio of an outer concentric region distal to the center of the second GDP 9, also similar to the arrangement of the plurality of first holes 5" of the first GDP 5 previously discussed. However, in order to divert the gas flow respectively by the first GDP 5 and the second GDP 9, the plurality of the second holes 9" are misaligned with the plurality of the first holes 5" in a thickness direction Z of the first GDP 5. That is, subsequent to gas flow flowing through a second holes 9", the gas flow does not directly flow through a first hole 5" in the thickness direction Z of the first GDP 5 through the corresponding second hole 9", therefore the direction of the gas flow may be diverted by both the second GDP 9 and the first GDP 5, further enhancing the effectiveness of redistributing gas flow. In some embodiments, the second GDP 9 may have an open ratio smaller than an open ratio of the first GDP 5, wherein the open ratio of the second GDP 9 is the total area of the plurality of second holes 9" over the overall area of the second GDP 9, and the open ratio of the first GDP 5 is the total area of the plurality of first holes 5" over the overall area of the first GDP 5. In some embodiments, a density of the plurality of second holes 9" may be smaller than a density of the plurality of the first holes 5". In some embodiments, a size of the plurality of second holes 9" may be smaller than a size of the plurality of the first holes 5".

Figure 9A:
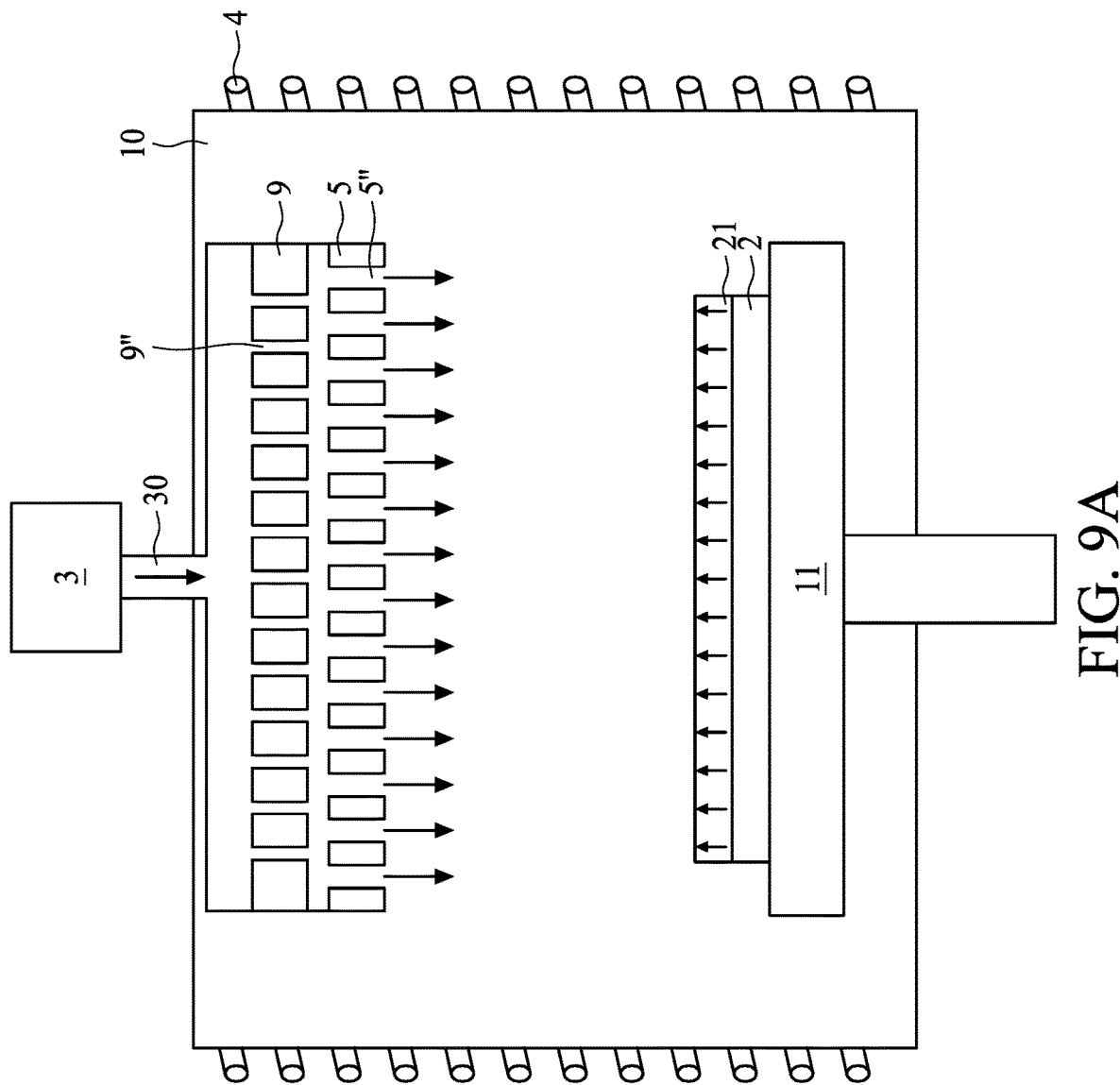
FIG. 9A is a schematic drawing illustrating an apparatus during a semiconductor device fabricated at various stages, in accordance with some embodiments of the present disclosure.

Referring to FIG. 9A, the reaction chamber 10 having the gas inlet 30 and the first GDP 5 previously discussed in FIG. 2A, 2B, 3A, or 3B is provided and the substrate 2 is loaded in the reaction chamber 10. Subsequently a gas flow of a predetermined operation is supplied from the gas inlet 30, flowed through the plurality of the second holes 9" of the first GDP 9 and the plurality of the first holes 5" of the first GDP 5, and thus flowed toward the substrate 2. A layer 21 is thereby formed above the substrate 2. As previously discussed in FIG. 8, by virtue of the second GDP 9 between the first GDP 5 and the gas inlet 30, the effectiveness of redistributing the gas flow may be further enhanced. In some embodiments, the operation includes chemical vapor deposition (CVD), plasma-enhanced CVP (PECVD), metal-organic CVD (MOCVD), atomic layer deposition (ALD), remote plasma enhanced CVD (RPECVD), liquid source misted chemical deposition (LSMCD), film depositing, or the like. In some embodiments, the gas flow may include gaseous substances, plasma, a combination of gas flow and plasma, or the like.

Figure 9B:
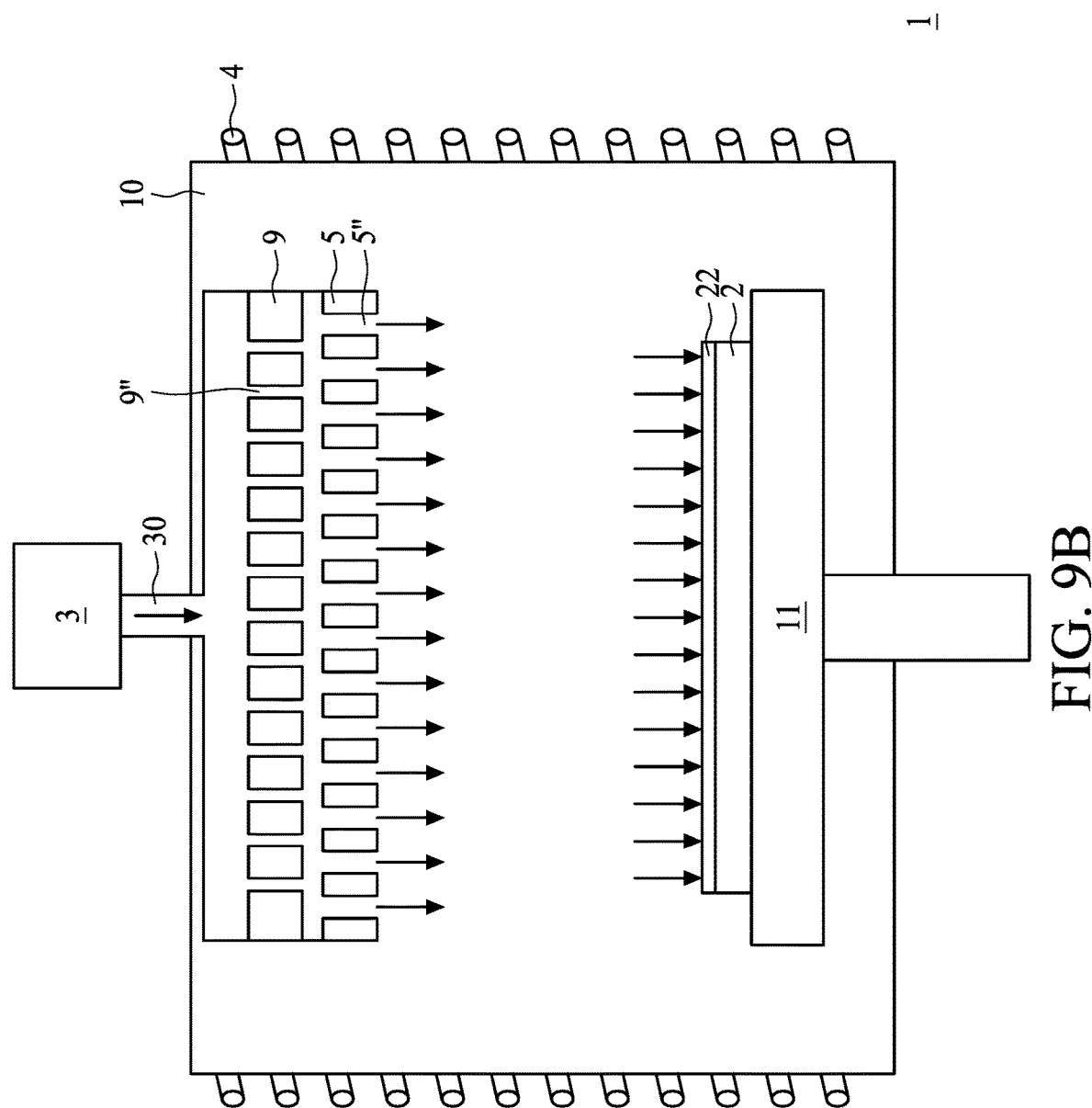
FIG. 9B is a schematic drawing illustrating an apparatus during a semiconductor device fabricated at various stages, in accordance with some embodiments of the present disclosure.

Referring FIG. 9B, the reaction chamber 10 having the gas inlet 30 and the first GDP 5 previously discussed in FIG. 2A, 2B, 3A, or 3B is provided and the substrate 2 is loaded in the reaction chamber 10. Subsequently a gas flow of a predetermined operation is supplied from the gas inlet 30, flowed through the plurality of the second holes 9" of the first GDP 9 and the plurality of the first holes 5" of the first GDP 5, and thus flowed toward the substrate 2. A layer 22 above the substrate 2 is thereby removed. As previously discussed in FIG. 8, by providing the second GDP 9 between the first GDP 5 and the gas inlet 30, the effectiveness of redistributing the gas flow may be further enhanced. In some embodiments, the operation includes ashing/stripping, etching, film removal, or the like. In some embodiments, the gas flow may include gaseous substances, plasma, a combination of gas flow and plasma, or the like.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

Some embodiments of the present disclosure provide an apparatus for fabricating a semiconductor device, including a reaction chamber having a gas inlet for receiving a gas flow, a pedestal in the reaction chamber configured to support a substrate, and a first gas distribution plate (GDP) in the reaction chamber and between the gas inlet and the pedestal, wherein the first GDP is configured to include a plurality of concentric regions arranged along a radial direction, and a plurality of first holes arranged in the concentric regions of the first GDP, an open ratio of the first GDP in an outer concentric region is greater than that in an inner concentric region proximal to the outer concentric region to redistribute the gas flow.

Some embodiments of the present disclosure provide a gas distribution plate (GDP), including a plate having a first concentric region, a second concentric region surrounding and abutting the first concentric region, and a third concentric region surrounding and abutting the second concentric region, a plurality of first apertures through the plate and arranged in the first concentric region, a plurality of second apertures through the plate and arranged in the second concentric region, and a plurality of third apertures through the plate and arranged in the third concentric region, wherein an open ratio of the plurality of second apertures to an area of the second concentric region is greater than an area ratio of the plurality of first apertures to an area of the first concentric region, and an open ratio of the plurality of third apertures to an area of the third concentric region is greater than the area ratio of the plurality of second apertures to the area of the second concentric region.

Some embodiments of the present disclosure provide a method for fabricating a semiconductor device, including loading a substrate in a reaction chamber, processing the substrate by supplying a gas flow from a gas inlet to the substrate through a plurality of first holes of a first GDP configured to redistribute the gas flow, wherein the first GDP comprises a plurality of concentric regions, the plurality of first holes are arranged in the concentric regions of the first GDP, and an open ratio of the first GDP in an outer concentric region is greater than that in an inner concentric region proximal to the outer concentric region.

What is claimed is:

1. An apparatus for fabricating a semiconductor device, comprising:
    a reaction chamber having a gas inlet for receiving a gas flow;
    a pedestal in the reaction chamber configured to support a substrate;
    a first gas distribution plate (GDP) in the reaction chamber and between the gas inlet and the pedestal; and
    a plurality of first holes configured on the first GDP, each of the first holes has a circular shape, each center of the first holes are arranged at intersections of a plurality of imaginary concentric circles and more than one Archimedean spirals, the plurality of the first holes comprises:
    a first group of the first holes, each of the first group of the first holes has a center arranged along a first imaginary circle;
    a second group of the first holes, each of the second group of the first holes has a center arranged along a second imaginary circle; and
    a third group of the first holes, each of the third group of the first holes has a center arranged along a third imaginary circle, wherein:
        the first imaginary circle, the second imaginary circle, and the third imaginary circle are concentric and equally distanced;
        a first distance is between a center of the first GDP and a center of one of the first holes in the first group;
        a second distance is between a center of the first GDP and a center of one of the first holes in the second group;
        a third distance is between a center of the first GDP and a center of one of the first holes in the third group; and
        a difference between the first distance and the second distance is identical to a difference between the second distance and the third distance.

2. The apparatus for fabricating the semiconductor device of claim 1, wherein the first GDP is configured to include a plurality of concentric regions arranged along a radial direction, and the plurality of the first holes are arranged in the concentric regions of the first GDP, an open ratio of the first GDP in an outer concentric region is greater than that in an inner concentric region proximal to the outer concentric region to redistribute the gas flow, the plurality of concentric regions comprises:

a first concentric region;
a second concentric region surrounding and abutting the first concentric region; and
a third concentric region surrounding and abutting the second concentric region, wherein the first concentric region, the second concentric region and the third concentric region have the same width measured along the radial direction of the first GDP.

3. The apparatus for fabricating the semiconductor device of claim 2, wherein the plurality of the first holes have substantially the same size, a density of the first holes in the second concentric region is greater than a density of the first holes in the first concentric region, and a density of the first holes in the third concentric region is greater than the density of the first holes in the second concentric region.

4. The apparatus for fabricating the semiconductor device of claim 2, wherein a density of the first holes in the first concentric region substantially equals to a density of the first holes in the second concentric region and the first holes in the third concentric region, a size of the first holes in the second concentric region is greater than or equal to a size of the first holes in the first concentric region, and a size of the first holes in the third concentric region is greater than or equal to the size of the first holes in the second concentric region.

5. The apparatus for fabricating the semiconductor device of claim 1, further comprising a second GDP between the gas inlet and the first GDP.

6. The apparatus for fabricating the semiconductor device of claim 5, wherein the second GDP includes a plurality of second holes, wherein the plurality of the second holes are misaligned with the plurality of the first holes in a thickness direction of the first GDP.

7. The apparatus for fabricating the semiconductor device of claim 5, wherein an open ratio of the second GDP is smaller than an open ratio of the first GDP.

8. The apparatus for fabricating the semiconductor device of claim 5, wherein the first GDP is apart from the second GDP.

9. The apparatus for fabricating the semiconductor device of claim 1, wherein a space between the first imaginary circle and the second imaginary circle is free from having an entire first hole therein.

10. The apparatus for fabricating the semiconductor device of claim 1, wherein the gas inlet further comprises a pressure regulator.

11. A gas distribution plate (GDP), comprising:
a plate having a first concentric region, a second concentric region surrounding and abutting the first concentric region, and a third concentric region surrounding and abutting the second concentric region;
a plurality of first apertures through the plate, and each of the first apertures has a center arranged along a first imaginary circle in the first concentric region;
a plurality of second apertures through the plate, and each of the second apertures has a center arranged along a second imaginary circle in the second concentric region; and
a plurality of third apertures through the plate, and each of the third apertures has a center arranged along a third imaginary circle in the third concentric region,
wherein an open ratio of the plurality of second apertures to an area of the second concentric region is greater than an area ratio of the plurality of first apertures to an area of the first concentric region, and an area ratio of the plurality of third apertures to an area of the third concentric region is greater than the open ratio of the plurality of second apertures to the area of the second concentric region, wherein:
each of the first apertures, the second apertures, and the third apertures has a circular shape;
the first imaginary circle, the second imaginary circle, and the third imaginary circle are concentric and equally distanced;
each of a center of one first aperture, one second aperture, and one third aperture are disposed on a curve line having a function of $r=a*\theta+b$, wherein r and $\theta$ are polar coordinates, and a and b are constants;
a first distance is between a center of the plate and the center of the first aperture on the curve line;
a second distance is between the center of the plate and the center of the second aperture on the curve line;
a third distance is between the center of the plate and the center of the third aperture on the curve line; and
a difference between the first distance and the second distance is identical to a difference between the second distance and the third distance, and
each of the center of another one of the first apertures, another one of the second apertures and another one of the third apertures are disposed on a second curve line having a function of $r=a*\theta+b$, wherein r and $\theta$ are polar coordinates.

12. The GDP of claim 11, wherein the first concentric region, the second concentric region and the third concentric region have the same width measured along a radial direction of the plate.

13. The GDP of claim 11, wherein the first apertures, the second apertures and the third apertures have substantially the same size, a density of the second apertures is greater than a density of the first apertures, and a density of the third apertures is greater than the density of the second apertures.

14. The GDP of claim 11, wherein a density of the first apertures equals to a density of the second apertures and a third density of the third apertures, a size of the second apertures is larger than a size of the first apertures, and a size of the third apertures is larger than the size of the second apertures.

15. An apparatus for fabricating a semiconductor device, comprising,
a gas source;
a reaction chamber, comprising a gas inlet connected to the gas source;
a first gas distribution plate (GDP) under the gas source, comprising a plurality of first holes arranged in a first asymmetric pattern, wherein:
each of the first holes has a circular shape, each center of the first holes are arranged at intersections of a plurality of imaginary concentric circles and more than one Archimedean spirals, the plurality of the first holes comprises:
a first group of the first holes, each has a center arranged along a first imaginary circle;
a second group of the first holes, each has a center arranged along a second imaginary circle; and
a third group of the first holes, each has a center arranged along a third imaginary circle, wherein:
the first imaginary circle, the second imaginary circle, and the third imaginary circle are concentric and equally distanced;
a first distance is between the center of the first GDP and a center of one of the first holes in the first group;
a second distance is between the center of the first GDP and a center of one of the first holes in the second group;

a third distance is between the center of the first GDP and a center of one of the first holes in the third group; and
    a difference between the first distance and the second distance is identical to a difference between the second distance and the third distance; and
  a second GDP between the first GDP and the gas inlet, comprising a plurality of second holes misaligned with the first holes.

16. The apparatus for fabricating the semiconductor device of claim 15, wherein the second holes are arranged along a plurality of concentric circles.

17. The apparatus for fabricating the semiconductor device of claim 15, wherein the first GDP is apart from the second GDP.

18. The apparatus for fabricating the semiconductor device of claim 15, wherein an open ratio of the second GDP is different from an open ratio of the first GDP.

19. The apparatus for fabricating the semiconductor device of claim 15, further comprising a pedestal in the reaction chamber and under the first GDP.

20. The apparatus for fabricating the semiconductor device of claim 15, further comprising a coil surrounding the reaction chamber.

* * * * *